United States Patent [19]
Bracchitta et al.

[11] Patent Number: 5,949,265
[45] Date of Patent: Sep. 7, 1999

[54] SOFT LATCH CIRCUIT HAVING SHARP-CORNERED HYSTERESIS CHARACTERISTICS

[75] Inventors: John Anthony Bracchitta; Michel Salib Michail, both of South Burlington; Wilbur David Pricer, Charlotte, all of Vt.

[73] Assignee: International Business Machines Corporation, Armonk, N.Y.

[21] Appl. No.: 08/961,928

[22] Filed: Oct. 31, 1997

[51] Int. Cl.$^6$ .................................................. H03K 3/037
[52] U.S. Cl. ............................ 327/206; 327/210; 327/214
[58] Field of Search ...................................... 327/199, 202, 327/203, 208, 209, 210, 215, 219, 206, 205, 214

[56] References Cited

U.S. PATENT DOCUMENTS

| | | |
|---|---|---|
| 4,295,062 | 10/1981 | Mihalich et al. ....................... 327/206 |
| 4,786,825 | 11/1988 | O'Shaughnessy et al. ............. 327/206 |
| 5,107,137 | 4/1992 | Kinugasa et al. ....................... 327/203 |
| 5,369,319 | 11/1994 | Good et al. .............................. 327/206 |
| 5,382,840 | 1/1995 | Massoner ................................ 327/206 |
| 5,512,852 | 4/1996 | Kowalski ................................ 327/206 |
| 5,608,344 | 3/1997 | Marlow ................................... 327/206 |

*Primary Examiner*—Toan Tran
*Attorney, Agent, or Firm*—Schmeiser, Olsen & Watts; Robert A. Walsh

[57] ABSTRACT

A soft latch circuit having a first and second inverter is disclosed. The output of the first inverter is connected to the input of the second inverter, and the output of the second inverter is connected to the input of the first inverter. The first inverter includes a complimentary pair of field-effect transistors (FETs). The second inverter includes either a complimentary pair of current mirrors, or a current mirror and a complimentary FET, the latter providing improved noise immunity characteristics when the soft latch is set in only one direction.

20 Claims, 10 Drawing Sheets

SOFT LATCH CIRCUIT HAVING SHARP-CORNERED HYSTERESIS CHARACTERISTICS

BACKGROUND OF THE INVENTION

1. Technical Field

The invention relates generally to electrical circuits, and more specifically, to soft latches in electrical circuits.

2. Background Art

Driver receiver systems in networks that are subject to noise often include a latch to improve internal waveforms by means of hysteresis. Typically, a driver receiver system includes a latch directly in the signal path to allow the internal network voltage to switch between logic states when a threshold voltage has been reached. Normal latches used directly in the signal path, though, create a time delay as the latch is set and reset with each new logic transient.

Soft latches may be used in driver receiver systems to catch and hold logic signals without incurring the time delay normally seen in setting or resetting a normal latch. Furthermore, soft latches, like normal latches, can be used to stabilize otherwise floating nodes. In recent years, applications of soft latches have been expanded to include insertion into large networks or on circuit nodes which receive their logic signals from across large networks. Some examples of these large networks include microprocessor buses and DRAM chip to chip wiring networks. Unfortunately, these large networks are susceptible to multiple noise sources. A conventional soft latch's resistance to extended noise gradually weakens as a function of time. The hysteresis characteristics of a conventional soft latch has "soft" corners. Thus, noise may be propagated past the common input/output node of a conventional soft latch or even set the soft latch into an erroneous state.

One solution in dealing with noise in a large network is the use of a low frequency filter. Filtering, though, adds a signal delay to the circuit, thus defeating one of the purposes of using a soft latch.

There has arisen, therefore, a need for soft latches with improved noise immunity across a wide spectrum of noise sources and noise source frequencies.

SUMMARY OF THE INVENTION

It is thus an advantage of the present invention to provide a soft latch with improved noise immunity across a wide spectrum of noise source and frequencies.

It is a further advantage of the present invention to provide a soft latch with sharp-cornered hysteresis characteristics.

The advantages of the invention are realized by a latch circuit having a first and second inverter. The output of the first inverter is connected to the input of the second inverter, and the output of the second inverter is connected to the input of the first inverter. The first inverter comprises a conventional complimentary pair of field-effect transistors (FETs). The second inverter comprises either a complimentary pair of current mirrors, or a current mirror and a complimentary FET, the latter providing noise immunity characteristics only when the soft latch is set or reset.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
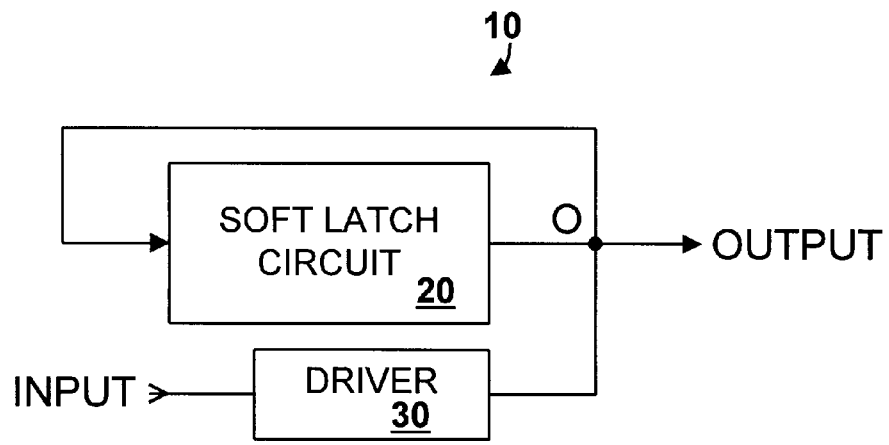
FIG. 1 is a block diagram of a driver receiver system.

Referring to FIG. 1, there is shown a block diagram of a driver receiver system 10 having a soft latch circuit 20, driver 30, and a receiver (not shown) connected to the output. An input passes through driver 30, which is coupled to the common input/output node, node O, of soft latch circuit 20. As aforementioned, soft latch circuit 20 is generally used as a feedback loop to driver 30 to improve output waveforms by means of hysteresis.

Figure 2:
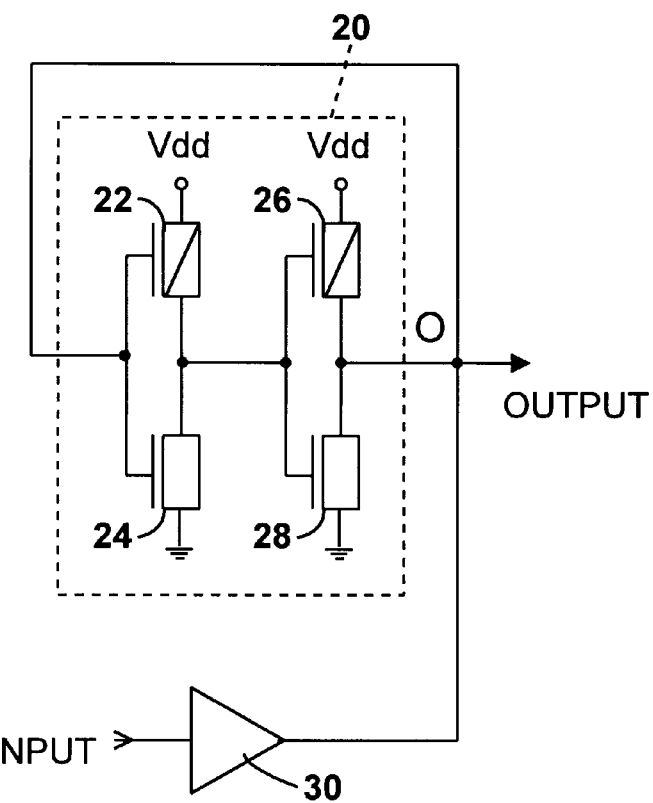
FIG. 2 is a schematic diagram of a conventional soft latch circuit used in the driver receiver system of FIG. 1.

FIG. 2 illustrates a conventional soft latch circuit 20 and driver 30. The driver consists of an inverter 30, which is connected to soft latch circuit 20. Soft latch circuit 20 comprises two inverters, each consisting of a p-channel field effect transistor (PFET) 22 and 26 and an n-channel field effect transistor (NFET) 24 and 28, respectively. The gates of PFET 22 and NFET 24 are coupled together, and to driver 30 at the common input/output node, node O, the output leading to other on-chip circuits. The drains of PFET 22 and NFET 24 are coupled together and are coupled to the gates of PFET 26 and NFET 28. The drains of PFET 26 and NFET 28 are coupled together, to driver 30 at node O. The sources of PFET 22 and PFET 26 are coupled to Vdd, and the sources of NFET 24 and NFET 28 are tied to ground. The driver 30 typically sets the latch circuit 20 to the down state by overpowering PFET 26.

Figure 3:
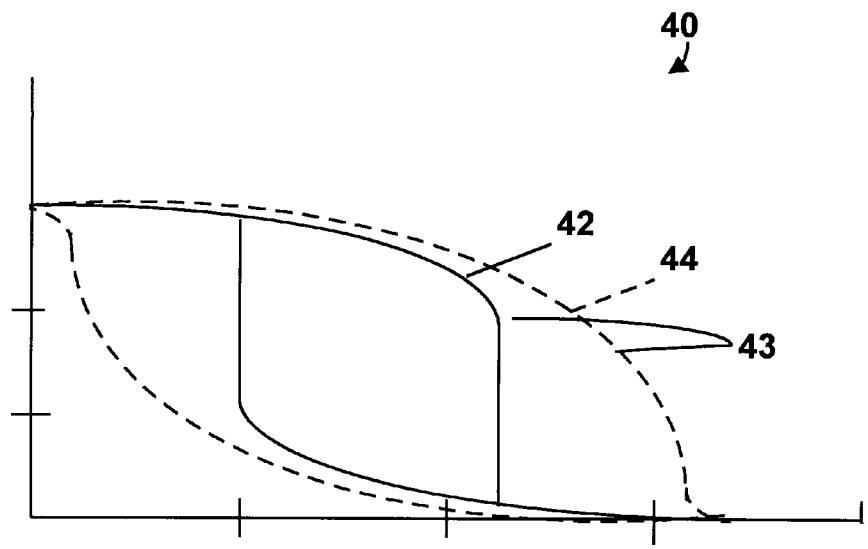
FIG. 3 shows a hysteresis characteristic curve of the conventional soft latch circuit of FIG. 2.

Two hysteresis characteristic curves 40 for FIG. 2 are shown in FIG. 3. One characteristic curve illustrates the output vs. the input of the driver receiver system 10 at a low frequency 42. The other characteristic curve illustrates the output vs. the input at a high frequency 44. As can be seen, for both curves the conventional soft latch exhibits a resistor-like load to the driver for signals below threshold 43, producing soft corners on its hysteresis. The resistor-like load first enables the soft corners in the characteristic and then allows unwanted signal to "leak" into the internal node of the latch; thus weakening the "stiffness" of the latch. Because it takes time for the unwanted signal to leak into the internal node, the latch's resistance to extended noise gradually weakens as a function of time.

Figure 4:
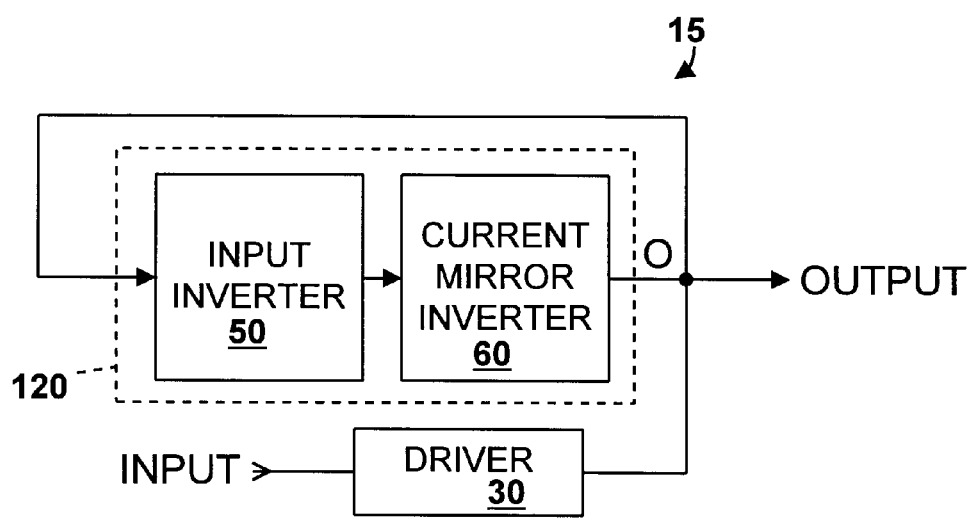
FIG. 4 is a block diagram of a soft latch circuit used in the driver receiver system of FIG. 1 in accordance with an embodiment of the present invention.

In reference to FIG. 4, the driver receiver system 15 in accordance with the present invention comprises driver 30 and soft latch circuit 120 having input inverter 50 and current mirror inverter 60. The input to input inverter 50 is coupled to the output of current mirror inverter 60, the output, and driver 30 at node O. The output of input inverter 50 is coupled to the input of current mirror inverter 60. In operation, the soft latch circuit 120 acts similarly to a short circuit to the power supply for all incoming signals less than the desired threshold. The short circuit "shorts out" noise; preventing it from propagating to other circuits and from "leaking" into the internal node of the latch. Once the threshold is reached, the soft latch circuit will switch into a very high impedance (e.g., current source) allowing the driver to quickly set the latch while simultaneously propagating the logic signal to the other logic circuits.

Figure 5:
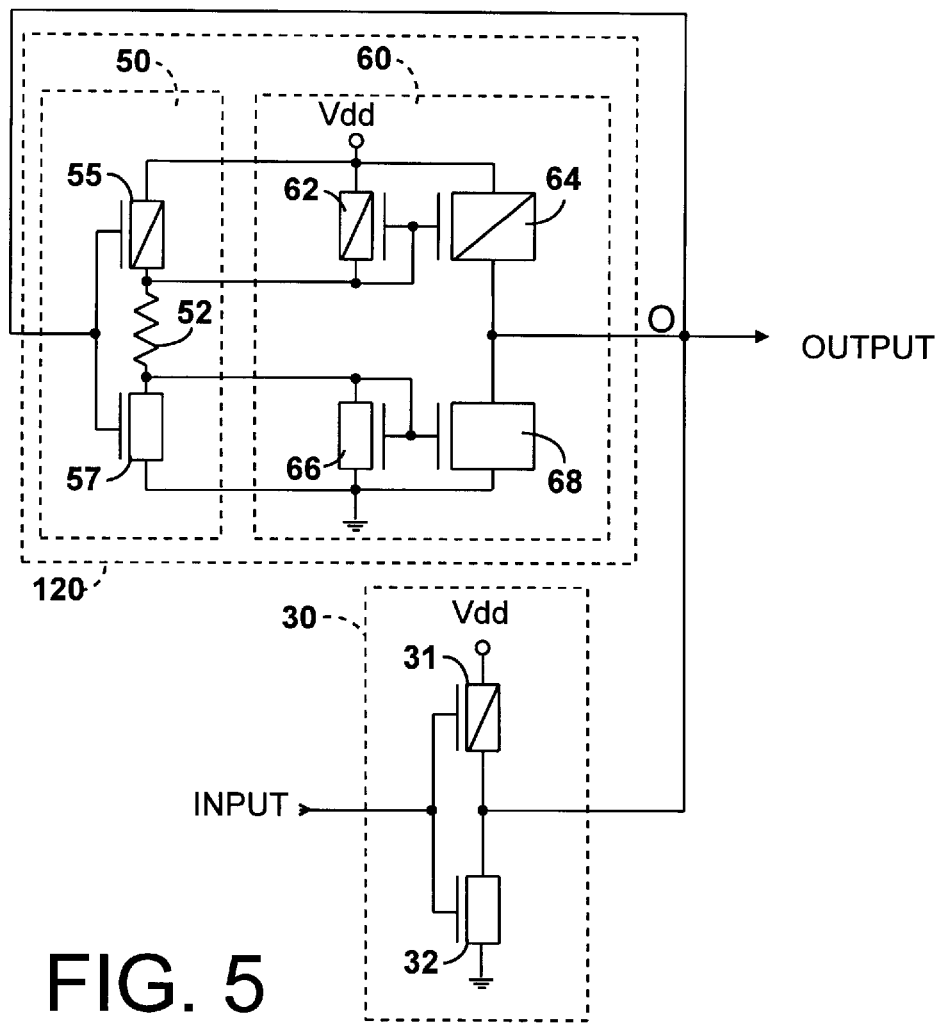
FIG. 5 is a schematic diagram of the soft latch circuit and driver of FIG. 4 in accordance with an embodiment of the present invention.

As seen in FIG. 5, an embodiment of the driver receiver system 15 of FIG. 4 is shown. Driver circuit consists of inverter 30, which in this example consists of a complimentary pair of FETS- PFET 31 and NFET 32. The gates of PFET 31 and NFET 32 are coupled together and to the input, and the drains of PFET 31 and NFET 32 are coupled together, to the soft latch circuit 120 and to the output. The sources of PFET 31 and NFET 32 are coupled to Vdd and ground, respectively. Input inverter 50 of the soft latch circuit 120 comprises a complimentary pair of FETs- PFET 55 and NFET 57. The gates of PFET 55 and NFET 57 are coupled together and their sources are coupled to Vdd and ground, respectively. The drains of PFET 55 and NFET 57 are coupled to a current limiting element, which limits the current to the current mirror inverter 60. In this example, the current limiting element is a resistor 52.

The current mirror inverter 60 comprises, in this embodiment, two pairs of current mirrors 62 with 64, and 66 with 68. The drain of PFET 62 is coupled to the drain of PFET 55 of the input inverter 50, and to the gates of PFET 62 and PFET 64. The sources of PFET 62 and PFET 64 are coupled to Vdd. The drain of NFET 66 is coupled to the drain of NFET 57 of the input inverter 50, and to the gates of NFET 66 and NFET 68. The sources of NFET 66 and NFET 68 are coupled to ground. The drains of PFET 64 and NFET 68 are coupled to together and to node O. The current mirrors may be adjusted through design to exhibit the exact same current drive as the original latch 20 in FIG. 2 but at a much lower voltage gate to source. The current mirrors in this example have a current amplification from input to output of between two to twenty.

Figure 6:
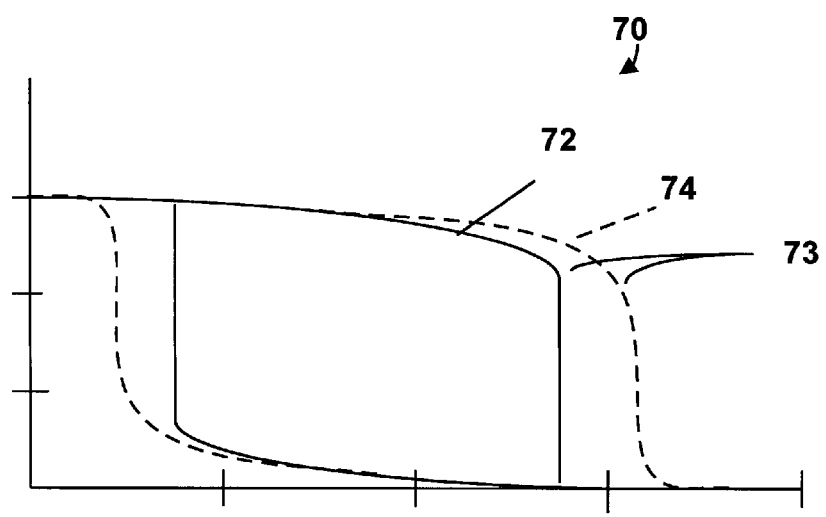
FIG. 6 shows a hysteresis characteristic curve of the soft latch circuit of FIG. 5.

FIG. 6 illustrates the hysteresis characteristic curves 70 of FIG. 5, using the same frequencies as shown in FIG. 3. That is, one characteristic curve illustrates the output vs. the input of the soft latch circuit 120 at a low frequency 72. The other characteristic curve illustrates the output vs. the input at a high frequency 74. As can be seen, the corners 73 are much sharper than the corners for FIG. 3 reflecting the short-circuit-like load conditions of the improved circuit. The low frequency hysteresis characteristic curve 72 is also wider than the low frequency curve 42 of FIG. 3, because with the current mirror inverter the unwanted signal can no longer easily leak into the internal node of the soft latch.

Figure 7:
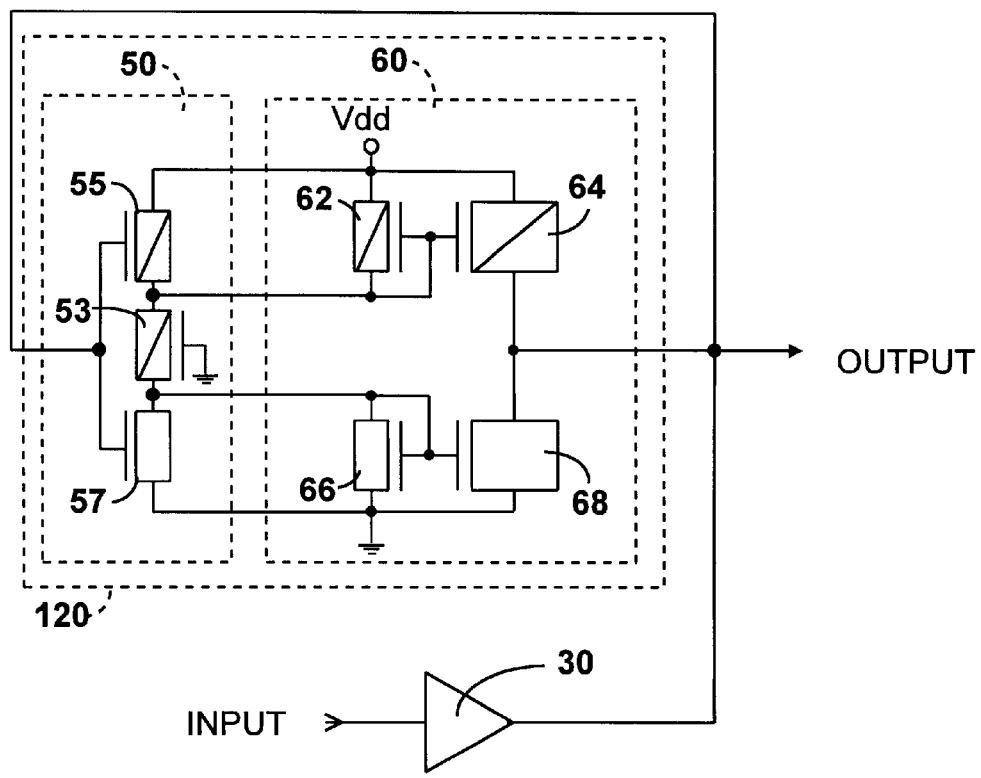
FIG. 7 is a schematic diagram of the soft latch circuit and driver of FIG. 4 in accordance with a preferred embodiment of the present invention.
Figure 16:
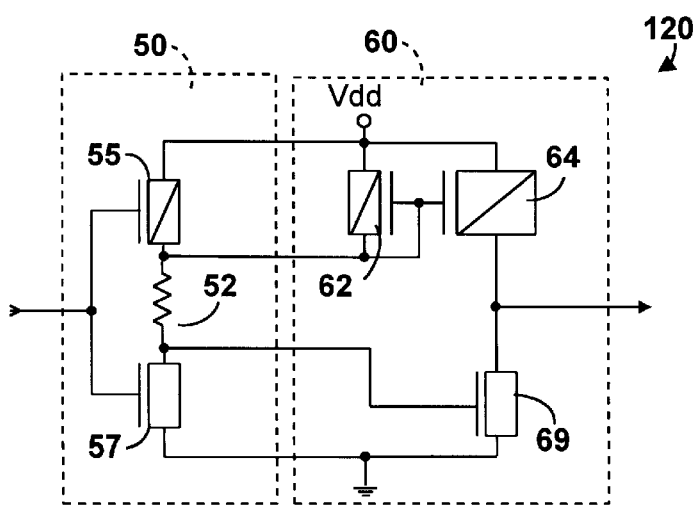
Figure 17:
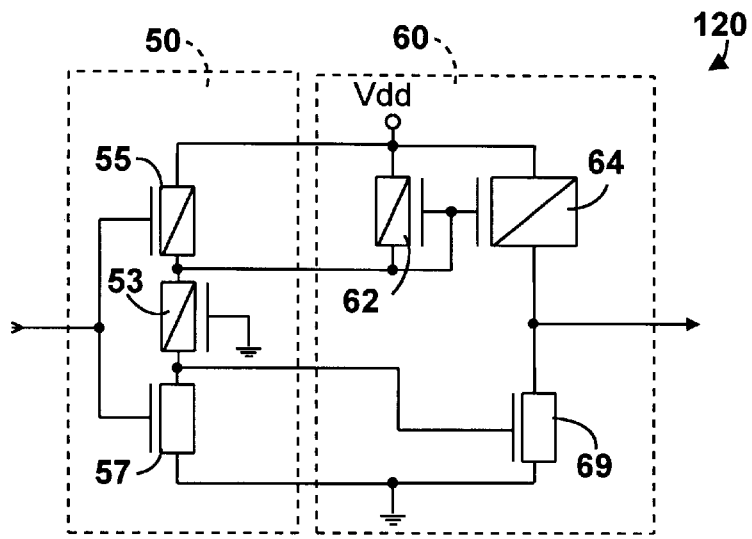
Figure 18:
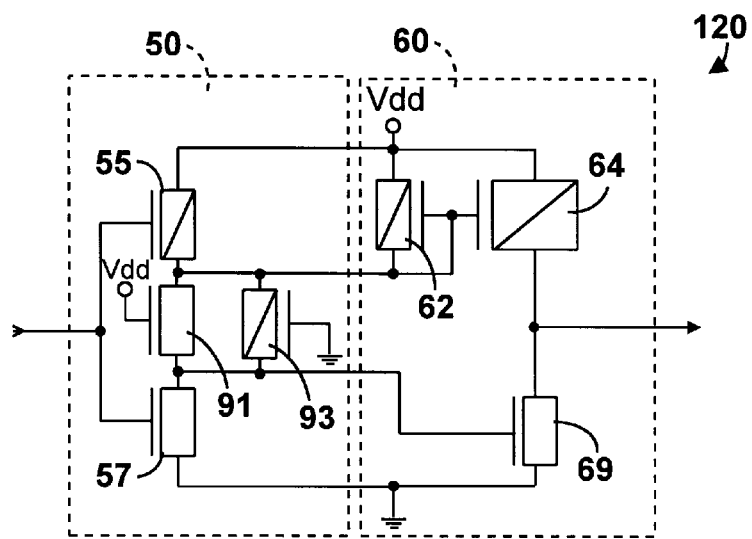
Figure 19:
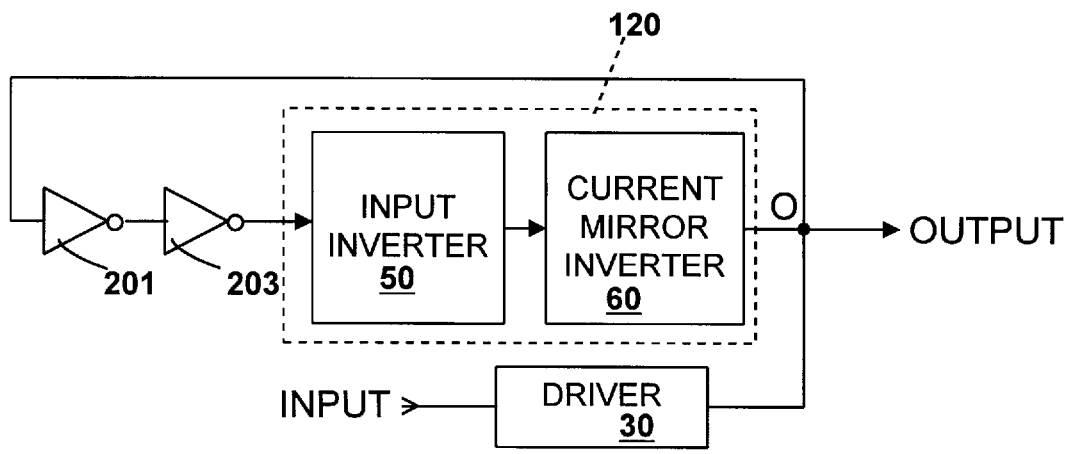
FIG. 19 is a block diagram of the driver receiver system of FIG. 1 in accordance with the present invention in which two inverters increase the sharpness of the hysteresis characteristic curve.
Figure 20:
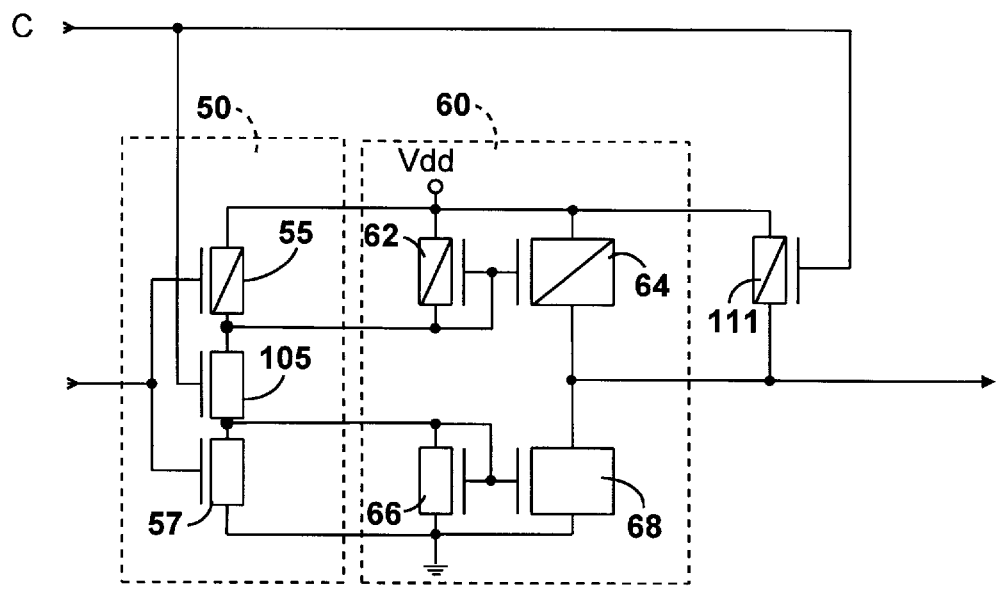
FIG. 20 is a schematic diagram of soft latch circuit of FIG. 4 with an additional low power feature in accordance with an embodiment of the present invention.

FIGS. 7–20 illustrate alternate embodiments of the soft latch circuit in accordance with the present invention, FIG. 7 illustrating the preferred embodiment. FIGS. 7–15 illustrates several examples of the soft latch circuit 120 wherein basically only the input inverter 50 and more specifically, the current limiting element of the input inverter 50 is being changed. The current mirror inverter 60 for these examples is similar to the exemplary current mirror inverter 60 of FIG. 5. FIGS. 16–18 illustrate three examples wherein the current mirror inverter 60 is imbalanced, consisting of only one current mirror and a complimentary FET. FIG. 19 illustrates how the invention may be modified to save power, and FIG. 20 shows a modification for further increasing noise immunity. The alternative coupling techniques of the following examples accomplish the same functions as FIG. 5, but with slightly different characteristics. For example, FIGS. 13 and 18 mimic the linear resistance technique of FIG. 5, but with the improved density of FETs.

Although specific examples will be shown in FIGS. 7–20, other appropriate examples may also be used. These and similar examples allow the designer to meet specific design constraints, such as separately adjusting the two switching thresholds of the hysteresis.

FIG. 7 illustrates the driver receiver system in accordance with the preferred embodiment of the present invention. As aforementioned, the current mirror inverter 60 is similar to the current mirror inverter as described in reference to FIG. 5. The input inverter 50 still comprises a complimentary pair of FETs 55 and 57, but now comprises PFET 53 as the current limiting element. The source of PFET 53 is coupled to the drain of PFET 55, the drain of PFET 53 is coupled to the drain of NFET 57, and the gate of PFET 53 is tied to ground. Replacing the resistor in FIG. 5 by the PFET 53 allows the soft latch circuit to be fabricated in a smaller area within an integrated circuit. However, more care must be taken in the design of the current mirrors to compensate for the unsymmetrical resistive characteristics of the substituted PFET.

Figure 8:
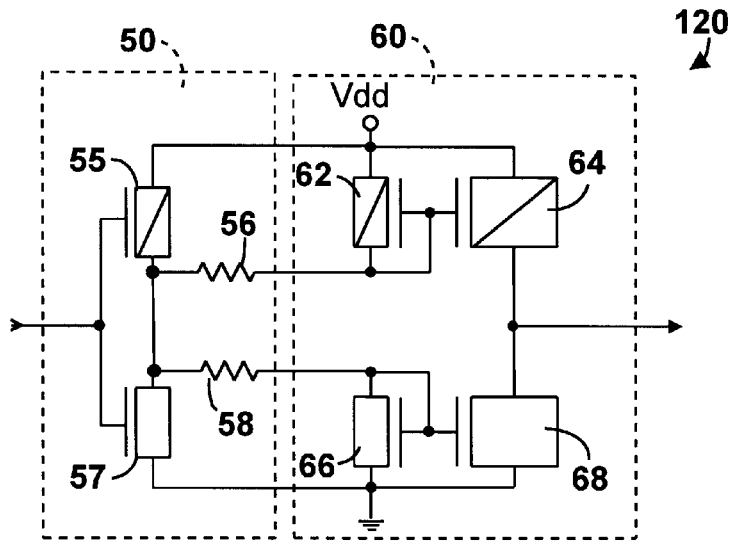
FIGS. 8, 9, 10, 11, 12, 13, 14, 15, 16, 17, and 18 are exemplary schematic diagrams of the soft latch circuit of FIG. 4 in accordance with various embodiments of the present invention.

As seen in FIG. 8, the current limiting element of input inverter 50 is made up of two resistors 56 and 58. Resistor 56 is coupled to resistor 58 and to the drains of PFET 55, NFET 57, and PFET 62. Resistor 58 is coupled to resistor 56 and to the drains of PFET 55, NFET 57 and NFET 66.

Figure 9:
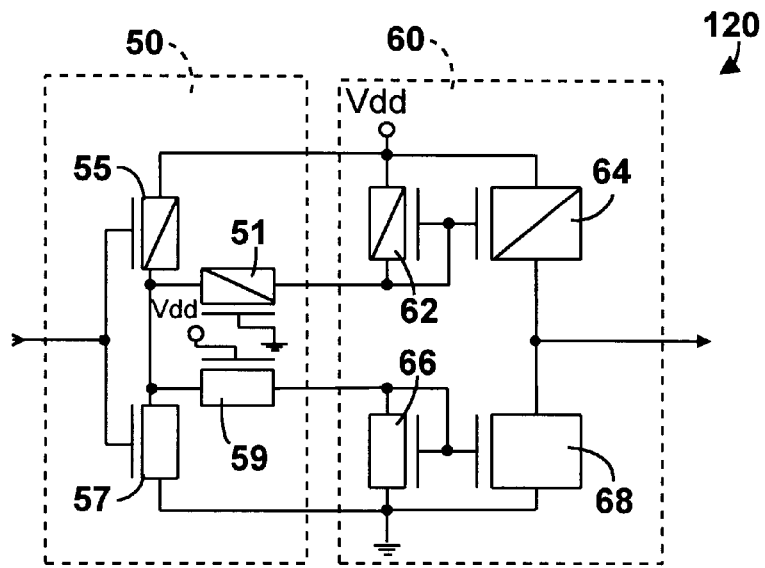

Referring to FIG. 9, the current limiting element of input inverter 50 comprises PFET 51 and NFET 59. The drain and source of PFET 51 are coupled to the drains of PFET 55 and PFET 62, respectively, and its gate is tied to ground. The drain and source of NFET 59 is coupled to the drains of NFET 57 and NFET 66, respectively, and its gate is tied to Vdd. The drains of PFET 55 and NFET 57 are commonly tied together.

Figure 10:
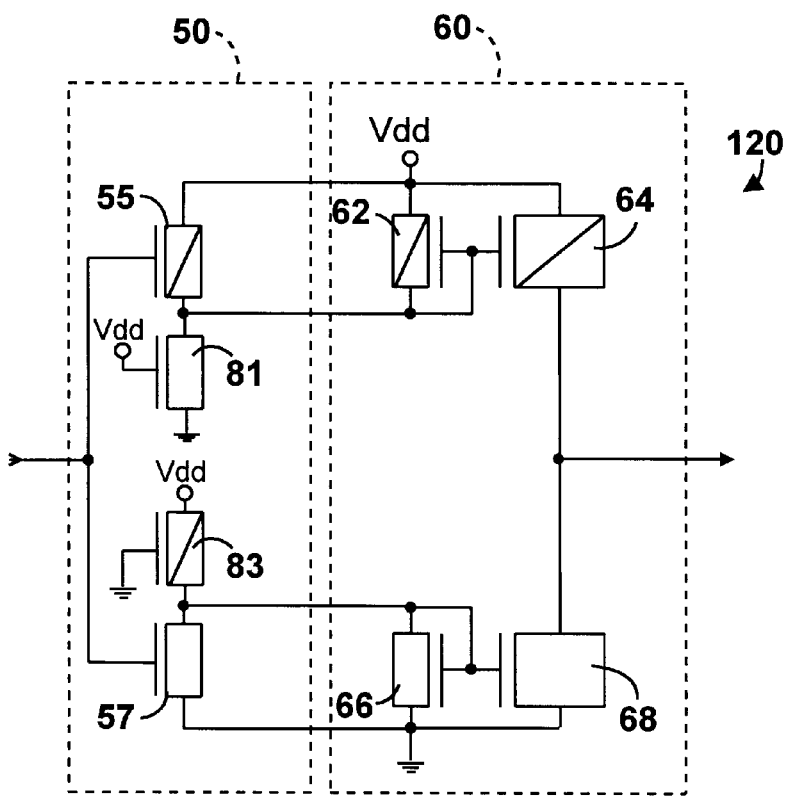

As seen in FIG. 10, the current limiting element of input inverter 50 comprises NFET 81 and PFET 83. The drains of NFET 81 and PFET 83 are coupled to the drains of PFET 55 and NFET 57, respectively. The gate of NFET 81 is coupled to Vdd and the source of NFET 81 is tied to ground. The gate of PFET 83 is coupled to ground and the source of PFET 83 is coupled to Vdd.

Figure 11:
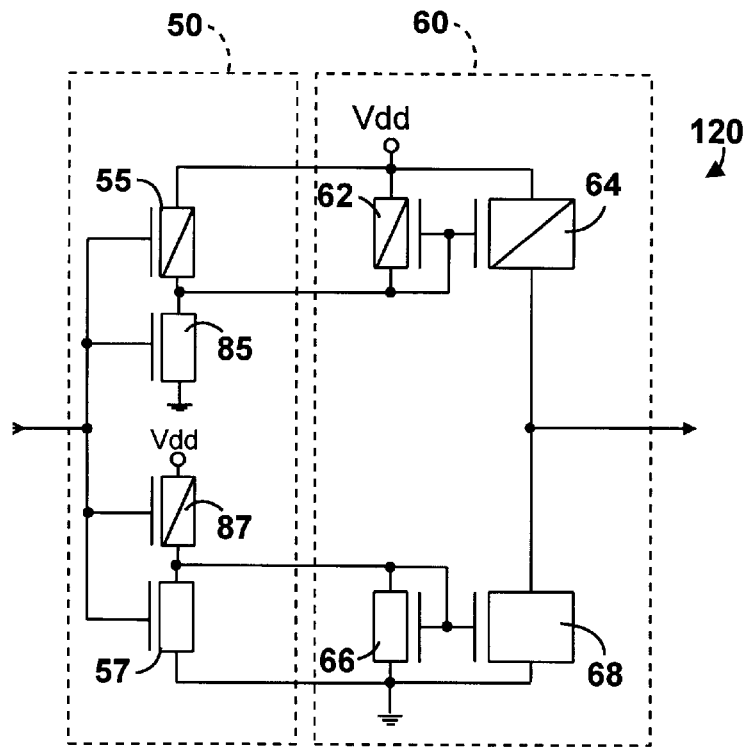

As seen in FIG. 11, the current limiting element of input inverter 50 comprises NFET 85 and PFET 87. The drains of NFET 85 and PFET 87 are coupled to the drains of PFET 55 and NFET 57, respectively. The gates of NFET 85 and PFET 87 are coupled together and to the gates of PFET 55 and NFET 57. The sources of NFET 85 and PFET 87 are coupled to ground and Vdd, respectively.

Figure 12:
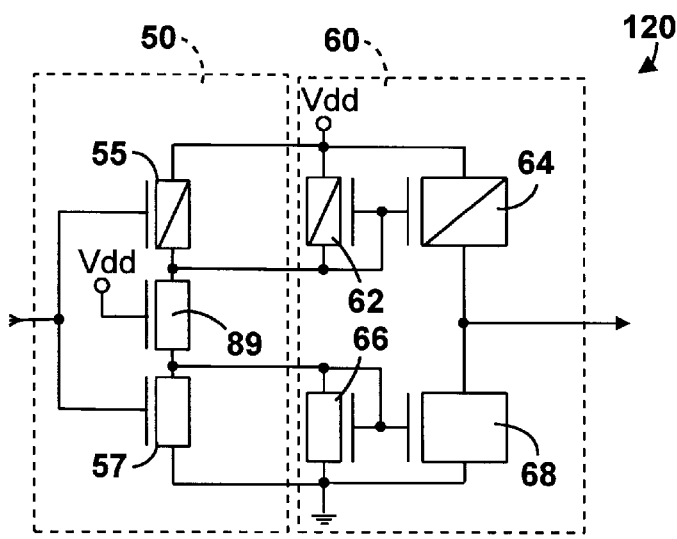

As seen in FIG. 12, the current limiting element of input inverter 50 comprises NFET 89. The drain and source of NFET 89 are coupled to the drains of PFET 55 and NFET 57, respectively. The gate of NFET 89 is coupled to Vdd.

Figure 13:
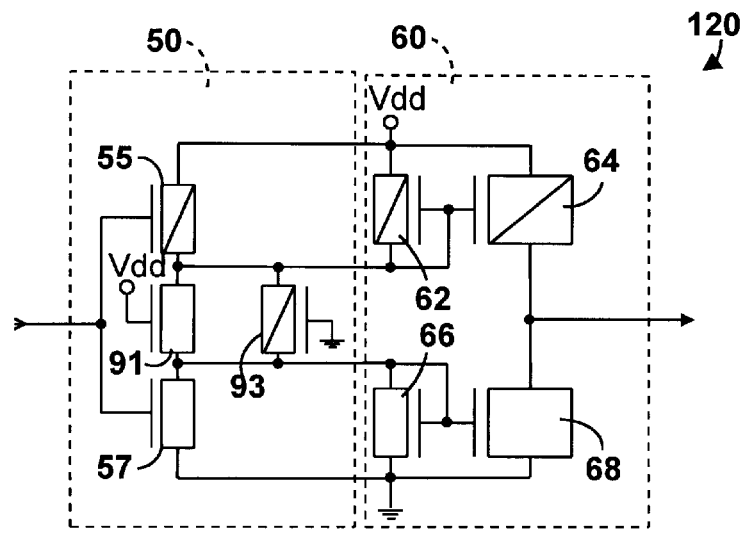

Referring to FIG. 13, the current limiting element of input inverter 50 comprises NFET 91 and PFET 93. The drain of NFET 91 and source of PFET 93 are coupled together and to the drain of PFET 55. The source of NFET 91 and drain of PFET 93 are coupled together and to the drain of NFET 57. The gates of NFET 91 and PFET 93 are coupled to Vdd and ground, respectively. As aforementioned, FIG. 13 mimics the linear resistance technique of FIG. 5, but with the improved density of FETs.

Figure 14:
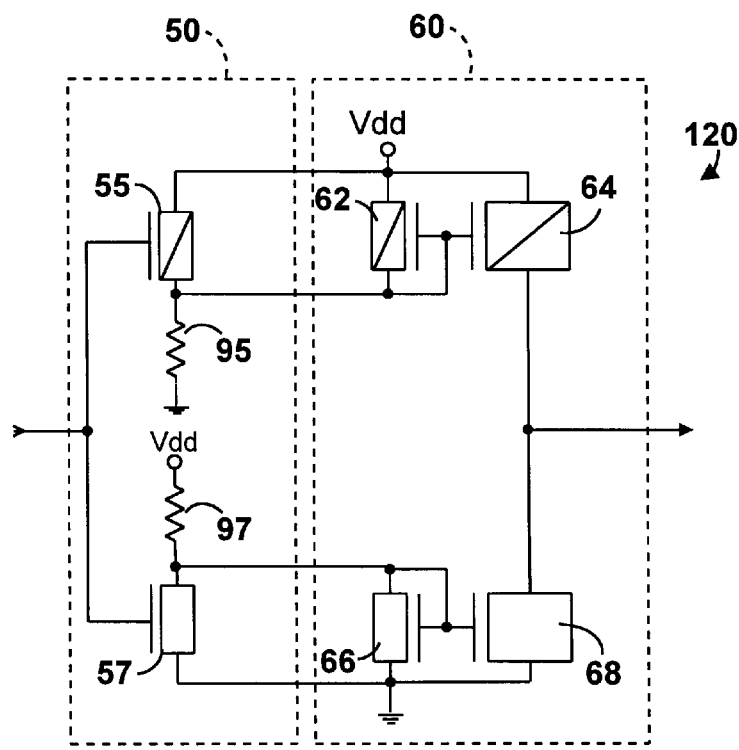

Referring to FIG. 14, the current limiting element of input inverter 50 comprises resistors 95 and 97. One terminal of resistor 95 is coupled to the drain of PFET 55, the other terminal is coupled to ground. One terminal of resistor 97 is coupled to the drain of NFET 57, the other terminal is coupled to Vdd.

Figure 15:
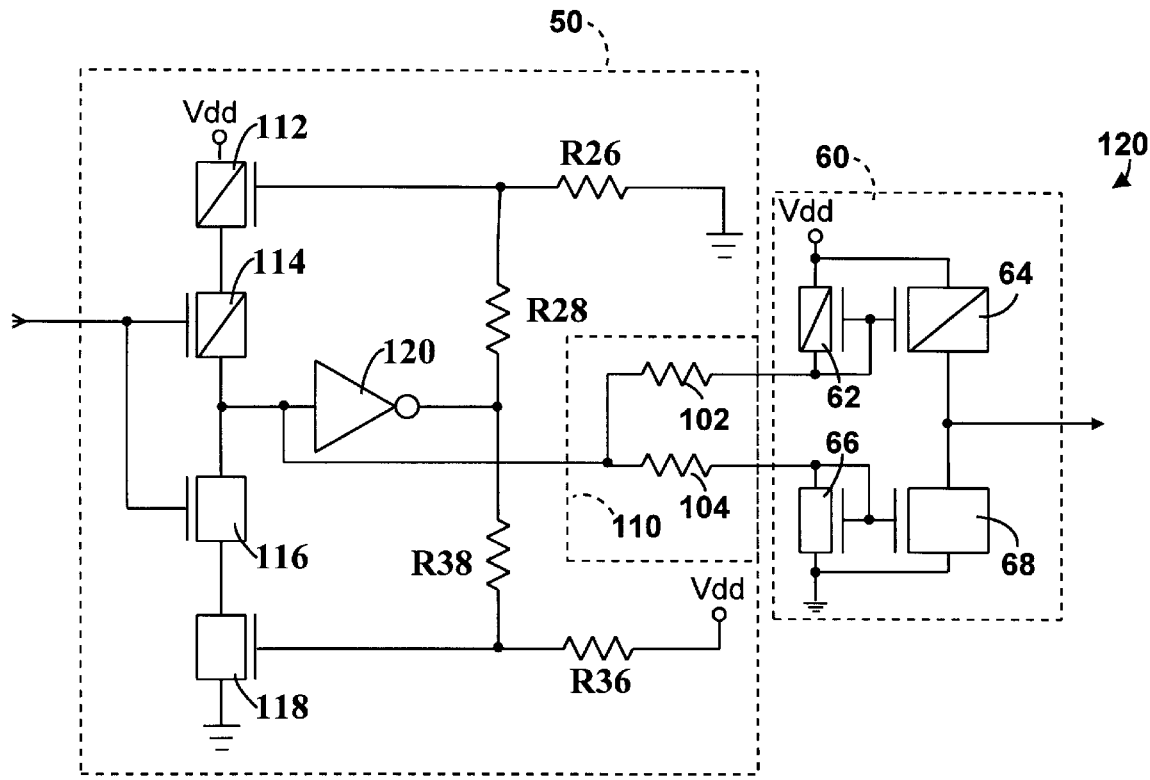

As shown in FIG. 15, a trigger circuit, such as one disclosed in patent application Ser. No. 08/711,424 to Michail, et al. entitled "Noise Tolerant CMOS Inverter Circuit Having a Resistive Bias" may also be used in input inverter 50. In this example, input inverter 50 comprises two resistors 102 and 104 and trigger circuit 110. As disclosed in patent application Ser. No. 08/711,424, trigger circuit 110 comprises transistors PFET 112 and PFET 114; complement transistors NFET 116 and NFET 118; inverter 120; and resistors R26, R28, R36 and R38. The drains of the inverter transistors 114 and 116 are coupled together, to the input of inverter 120 and to resistors 102 and 104. The gates of inverter transistors 114 and 116 are commonly tied to an input for receiving an input signal. The source of PFET 112 is tied to power supply Vdd, and the source of NFET 118 is tied to ground. The drain of PFET 112 is coupled to the source of PFET 114, and the drain of NFET 118 is coupled to the source of NFET 116. First resistor R26, second resistor R28, third resistor R38, and fourth resistor R36 are connected in series between ground and Vdd. The output of inverter 120 is coupled between second and third resistors R28 and R38. The gate of compensating PFET 112 is connected between the first and second resistors R26 and R28, and the gate of compensating NFET 118 is connected between third and fourth resistors R38 and R36. In operation, the trigger circuit 110 further increases the "stiffness" and sharpness of the corners of the hysteresis characteristic curve. Although this specific trigger circuit is used in this example, other appropriate trigger circuits may also be used.

As shown in FIGS. 16–18, a simpler embodiment is illustrated for the current mirror inverter 60, which is suitable for applications in which the improved characteristics of the driver receiver system are desired only when setting or resetting the soft latch 120. In these examples, the soft latch 120 exhibits superior noise immunity characteristics only when setting from the high into the low state. In FIGS. 16–18, the current mirror inverter 60 comprises current mirror FETs 62 and 64, and a complimentary NFET 69. The drain of PFET 62 is coupled to the drain of PFET 55 of the input inverter 50, and to the gates of PFET 62 and PFET 64. The sources of PFET 62 and PFET 64 are coupled to Vdd. The gate of NFET 69 is coupled to the drain of NFET 57 of the input inverter 50. The source of NFET 69 is coupled to ground. The drains of PFET 64 and NFET 69 are coupled to together and to the output. In FIG. 16, the input inverter 50 is similar to FIG. 5, wherein the current limiting element comprises resistor 52. In FIG. 17, the input inverter 50 is similar to FIG. 7, wherein the current limiting element comprises PFET 53. As seen in FIG. 18, the input inverter 50 is similar to FIG. 13, wherein the current limiting element comprises NFET 91 and PFET 93. Although these specific embodiments are shown for soft latch 120, other combinations and input inverters may also be used with the imbalanced current mirror inverter.

As seen in FIG. 19, the driver receiver system may be modified by inserting two inverters 201 and 203 between node O and the input of input inverter 50. The two inverters 201 and 203, at the cost of causing a slight signal delay, further increase the sharpness of the edges of the hysteresis characteristic curve and provide superior noise immunity to the system.

Referring to FIG. 20, the preferred embodiment is modified so that it can be deactivated when not in use, to save power. NFET 105, which limits the current to the current mirror inverter 60, is also now a switching transistor which turns off power to the soft latch 120 when not in use. This modification is done by coupling the gate of NFET 105 to a power saving device, which generates power saving signal C. A new optional PFET 111 may also be used to force the soft latch to an up state when not in use. Substituting a PFET for NFET 105 and an NFET for PFET 111 will produce a complementary soft latch, which is forced to the down state when not in use.

Thus, this invention provides a soft latch with improved noise immunity across a wide spectrum of noise source and frequencies.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A latch circuit comprising:
   a first inverter having a complimentary pair of field-effect transistors; and
   a second inverter having at least one current mirror, said at least one current mirror having a pair of field-effect transistors that are of the same type and whose gates are coupled together,
   wherein an output of said first inverter is coupled to the gates of said at least one current mirror and an output of said second inverter is coupled to an input of said first inverter.

2. The circuit of claim 1, wherein said second inverter comprises: a complimentary pair of current mirrors.

3. The circuit of claim 1, wherein said second inverter comprises: a current mirror and a field-effect transistor.

4. The circuit of claim 1, wherein said first inverter further comprises: a current limiting element at the output of said first inverter for limiting current to said current mirror.

5. The circuit of claim 1, wherein one of the at least one current mirror has a current amplification from input to output of at least two.

6. The circuit of claim 4, wherein said current limiting element comprises: at least one resistor.

7. The circuit of claim 4, wherein said current limiting element comprises: at least one field-effect transistor.

8. The circuit of claim 4, wherein said current limiting element is switchable for limiting power to the circuit when the circuit is not in use.

9. The circuit of claim 4, wherein the gates of the current mirror are further coupled to the current limiting element.

10. A driver receiver system comprising:
    a driver circuit; and
    a latch circuit, coupled to said driver circuit, including
       a first inverter having a complimentary pair of field-effect transistors, and a second inverter having at least one current mirror, said at least one current mirror having a pair of field-effect transistors that are of a same type and whose gates are coupled together, wherein an output of said first inverter is coupled to the gates of said at least one current mirror and an output of said driver circuit is coupled to an output of said second inverter and to an input of said first inverter.

11. The system of claim 10, wherein said second inverter comprises: a complimentary pair of current mirrors.

12. The system of claim 10, wherein said second inverter comprises: a current mirror and a field-effect transistor.

13. The system of claim 10, wherein said first inverter further comprises: a current limiting element for limiting current to said current mirror, said current limiting element coupled to the output of said first inverter.

14. The system of claim 10, wherein one of the at least one current mirror has a current amplification from input to output of at least two.

15. The system of claim 13, wherein said current limiting element comprises: at least one resistor.

16. The system of claim 13, wherein said current limiting element comprises: at least one field-effect transistor.

17. The system of claim 13, wherein said current limiting element is switchable for limiting power to the latch circuit when the latch circuit is not in use.

18. The system of claim 13 wherein the current limiting element is coupled to the gates of said pair of field-effect transistors of the current mirror.

19. A method of limiting noise in a driver receiver system comprising the steps of:

a) providing a first inverter having a complimentary pair of field-effect transistors;

b) providing a second inverter having at least one current mirror said at least one current mirror having a pair of field-effect transistors that are of a same type and whose gates are coupled together;

c) coupling an output of said first inverter the gates of said at least one current mirror; and d) coupling an output of said second inverter to an input of said first inverter.

20. The method of claim 19, wherein one of the at least one current mirror has a current amplification from input to output of at least two.

* * * * *